United States Patent [19]
de Niet et al.

[11] 3,958,160
[45] May 18, 1976

[54] CURRENT PULSE GENERATOR

[75] Inventors: Edmond de Niet; Adrianus Wilhelmus Maria van den Enden, both of Eindhoven, Netherlands

[73] Assignee: U.S. Philips Corporation, New York, N.Y.

[22] Filed: Jan. 9, 1975

[21] Appl. No.: 539,614

[30] Foreign Application Priority Data
Feb. 1, 1974  Netherlands...................... 7401401

[52] U.S. Cl. .......................... 317/148.5 R; 317/151
[51] Int. Cl.² ........................................ H01H 47/32
[58] Field of Search ........ 317/123, 151, 157, 148.5, 317/DIG. 4, DIG. 6

[56] References Cited
UNITED STATES PATENTS
3,025,411  3/1962  Rumble.............................. 317/151
3,072,045  1/1963  Goin .................................. 317/123

*Primary Examiner*—J. D. Miller
*Assistant Examiner*—Harry Moose
*Attorney, Agent, or Firm*—Frank R. Trifari; Daniel R. McGlynn

[57] ABSTRACT

The invention relates to a device for generating time-dependent currents in a coil, for example, a magnetic coil. A magnetic coil of this kind can be used, in combination with a second similar coil, for generating rotary magnetic fields in a device for transporting magnetic bubbles along a guide structure, consisting of discrete elements, on a plate of magnetic material. The device comprises two or more current connection terminals, an LC series oscillator circuit and a switching element which is connected in series with the coil. If the switching element is opened for a period of time amounting to one half to one whole oscillator period, the oscillator performs a whole period. A short-circuit element, connected parallel to the capacitor, can fully discharge the capacitor. When two switching elements are connected between a connection of the coil and a positive and a negative current connection terminal, respectively, whilst the other connection of the coil is connected to an earth terminal, oscillations at a phase difference of 180° can occur. In that case two short-circuit elements are required. A second magnetic field coil can be energized by a device which continues to energize the coil in the rest state, so that the direction of rotation of the rotary magnetic field can be reversed.

7 Claims, 6 Drawing Figures

CURRENT PULSE GENERATOR

The invention relates to a device for generating a time-dependent current in a coil, preferably a magnetic coil to be used in a device for generating a rotary magnetic field, comprising at least two current connection terminals, an oscillator circuit which comprises a capacitor besides the said coil, and at least one control terminal which can be connected to an output of a control device, a first signal appearing thereon being capable of operating a switching device connected thereto so as to control the said current. A device of this kind is known from the published Netherlands Pat. Application No. 7209154. The known device comprises an auxiliary coil in series with the coil and, connected parallel thereto, a field current amplifier which has a class-C operating characteristic. Furthermore, a switching element is connected in parallel across the series connection of the two coils and the capacitor. As a result, in the rest state the said capacitor is continuously charged. The amplitude of the current pulses is determined by the charge of the capacitor and a rather complex control amplifier. If a plurality of coils are to be energized in a device, each time such a control amplifier is required which makes the device complex. The invention has for its object to provide a simpler set-up and to this end it is characterized in that a switching element of said switching device, to be made one-way conductive and connected antiparallel to a rectifying element, forms aseries connection, with the oscillator circuit constructed as a series circuit, between said current connection terminals, a discharge element being connected parallel to the said capacitor and having an opposite polarity with respect to the said switching element, it being possible to make the said discharge element conductive after a period of the oscillator circuit by a second signal from the control device. Because, moreoverr, the capacitor is discharged in the rest state, such a device was found to have a plurality of control modes. Therefore, different rotary field programs can be realized. An accurately defined current program, and hence a specific magnetic field program, is very suitable, for example, for use in a device for storing and manipulating binary information in the form of magnetic bubbles which can be driven in a plate of magnetic material along a bubble guide structure consisting of discrete elements, for example, such as described in copending U.S. Pat. application Ser. No. 522,051 in the name of Applicant. The direction of rotation of the rotary magnetic field is then preferably reversible. Furthermore, in the case of a circuit which is not loss-free, the residual charge remaining in the capacitor after an oscillation period can then be depleted, so that the pattern of the time-dependent current can be identical in successive periods.

The said first signal is preferably capable of driving the said switching element to the conductive state for a period of time of between one half and one whole period of the oscillator circuit. The tolerances for the control signal are then broad and exactly one period is completed.

At least three current connection terminals of successive potentials are preferably provided, the said switching device comprising two switching elements having connected antiparallel thereto respective rectifying elements which are connected between a first end of said series circuit and respective current connection terminals of extreme potentials, a two-way discharging device, to be rendered conductive after a period of the oscillator circuit by a second signal from the control device, being connected parallel to the said capacitor, a second end of the said series circuit being connected to a third current connection terminal of intermediate potential. In that case two different current waveforms of opposite polarity are possible. This produces a variety of feasible control modes. It is advantageous to have a rotary magnetic field generator by which mutually transverse magnetic fields can be generated in a working area, whereby besides one coil of a device according to the foregoing, at least one second coil forms part of a device, consisting of a series connection of a fourth current connection terminal, a controllable current source circuit, a rectifying element, an oscillator circuit which is constructed as a parallel circuit comprising the said second coil and a capacitor, and a fifth current connection terminal, whereby a quiescent current can be passed. The second coil can thus remain energized in the rest state, with the result that the said magnetic bubbles occupy well-defined positions on a bubble guide structure composed of discrete elements, the said bubbles being hardly influenced by irregularities in the plate material or the bubble guide structure.

The invention will be described in detail hereinafter with reference to some figures.

Figure 1:
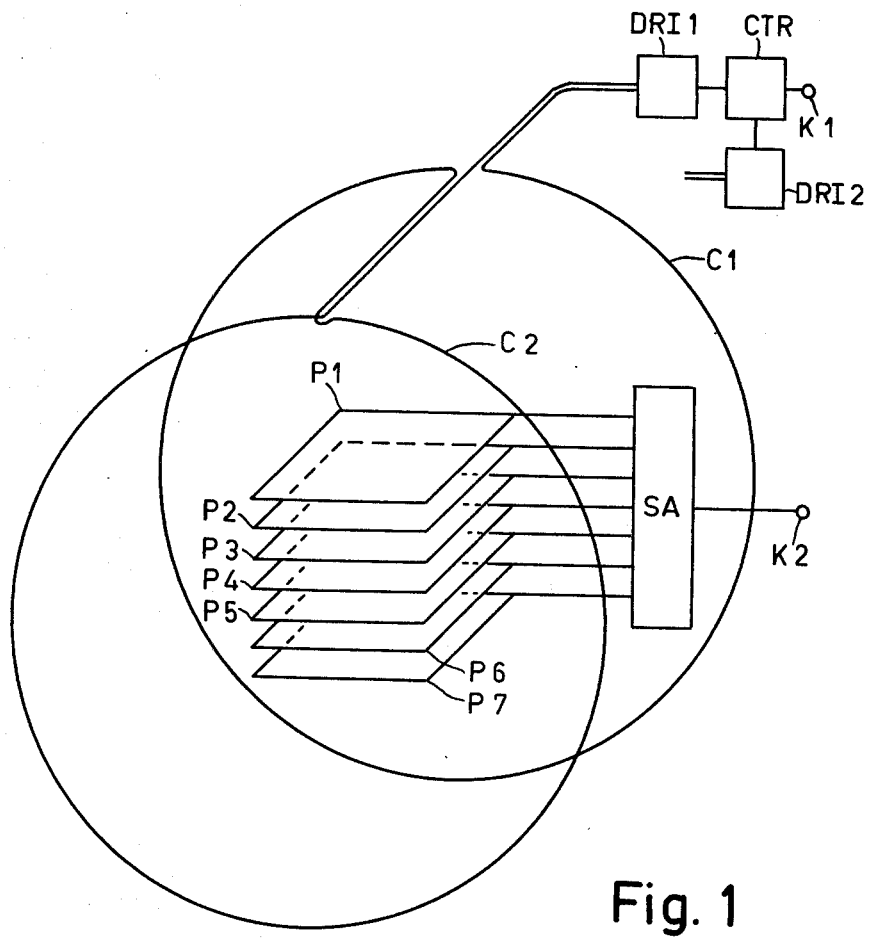
FIG. 1 shows a storage device comprising magnetic coils whereby a rotary magnetic field can be generated.

FIG. 1 shows a storage device according to the previous cited copending U.S. Pat. application in the name of Applicant, comprising an information input terminal K1, a control unit CTR, two rotary magnetic field generators DRI1, 2, seven plates of magnetic material P1 . . . 7, a read amplifier device SA, two electrically series-connected Helmholtz coils C1,2, and an information output terminal K2. The electrically interconnected Helmholtz coils are energized together and constitute only a single coil for the purpose of the present invention. There are also provided a main magnetic field generator and a second pair of Helmholtz coils which is orientated transverse to the first pair (not shown). The main magnetic field generator may be a permanent magnet, the field of which is directed transverse to the plates P1 . . . 7. Magnetic bubbles can be sustained in the plates of magnetic material by the main magnetic field. Information can be received on terminal K1. This information is processed in the control unit CTR to form control signals which are applied to the rotary magnetic field generators DRI1,2. The rotary magnetic field generator DRI1 applies time-dependent currents to the Helmholtz coils C1,2, so that a magnetic field component is generated which is parallel to the side of the plates P1 . . . 7 shown in perspective. Helmholtz coils produce a substantially homogeneous field in a working region near their centre plane and the axis of rotation. Analogously, two Helmholtz coils (not shown) are capable of generating an homogeneous field which is parallel to the plane of the drawing and the plates of magnetic material P1 . . . 7. Cooperation of the four Helmholtz coils can produce magnetic fields in all directions in the plane of the plates P1 . . . P7.

Under the influence of given rotary magnetic field sequences, the bubbles present on the plates P1 . . . 7 can be driven along a bubble guide structure provided thereon (not shown) and consisting of discrete elements. This guide structure can comprise a switching device along which bubbles can be driven as desired. If the various plates comprise diverging switches which are or which are not shifted with respect to each other, each can also be driven in a specific manner. A specific code can thus be formed for each of the plates.

The plates furthermore comprise detection elements which are connected to the read amplifier device SA via detection lines. This device applies the amplified read signals to terminal K2.

Figure 2:
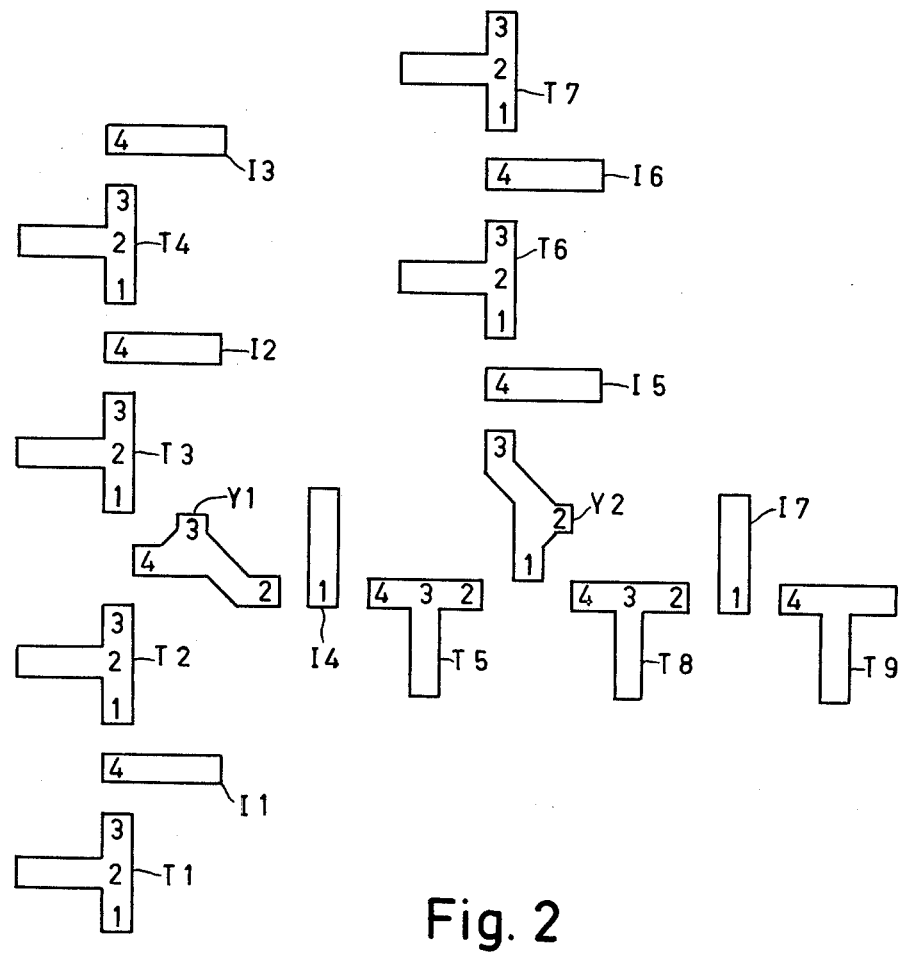
FIG. 2 shows a bubble guide structure for magnetic bubbles, composed of discrete elements, for use in such a storage device.

FIG. 2 shows a guide structure, consisting of discrete elements, for magnetic bubbles in a storage device as shown in FIG. 1, comprising diverging switches. The discrete elements may consist of permalloy, which is vapour-deposited on the plate of magnetic material (not shown) in the shape of a T. (T1 . . . 9), an I(1 . . . 7) or a Y (Y1,2). Other shapes are also possible. The elements may have different orientations. The bubbles may tend to prevail on the permalloy on an end which has the same direction as the rotary magnetic field. If this field is directed downwards in the plane of the drawing, the bubble is situated, for example, in position 1 of element T1: notation T11. If the field rotates to the right, the bubble advances to position 2 on element T1; notation T12. If the field rotates upwards in the plane of the drawing, the bubble advances to position T13, and if the field rotates to the left, the bubble jumps to position 4 on element I1 (notation I14).

During a second period of the rotation, the bubble advances to the positions T21, T22, T23, Y14. The element Y1 constitutes a part of a diverging switch. If the rotary magnetic field rotates counter-clockwise, the diverging switch at Y1 is in the position "straight forward," and the bubble proceeds via T31, T32, T33, I24.

If the direction of rotation of the rotary magnetic field is reversed, the movement direction of the bubble also changes: it returns, for example, from position T22, via position T21 . . . , to the position T11. If Y14 is passed during the return movement, the next position will be Y13 instead of T23, because the former is nearer. This "nearness" need not be a property of the geometry, but is co-determined by the magnetic properties of the permalloy. The next positions will then be Y13, Y12, I41 . . . , Y21, T84, so that the rotary magnetic field has been turned back over exactly two periods. If it subsequently rotates counter-clockwise again, the next positions will be Y21, Y22, Y23, I54 . . . . The diverging switch is then in the position "to the right." If a bubble is in position I54 and back rotation takes place over two periods, it advances to position T94, so that a further bubble can readily move to position T84. The element Y1 and its environment thus act as a diverging switch. If a bubble is present in one of the positions Y14 . . . T52 and the rotary magnetic field rotates counter-clockwise, the bubble ultimately proceeds in the direction of position I34. The element Y1 and its environment thus act also as a converging switch. Other rotary magnetic field sequences are alternatively possible, notably if a greater number of bubbles are involved: for example, through three periods of back rotation, two bubbles can be deflected together from positions I24, Y14 to T84 and T94, respectively. In the present example the discrete element T9 is the last one. If there are further elements present, the element Y2 and its environment can also act as a diverging switch: input from T5, outputs to I5 and T8, or as a converging switch: inputs from T5 and I5, output to element T8. The diverging switches of the figure are activated from one orientation of the rotary magnetic field, but other orientations are equally possible. These orientations may but need not correspond to the four possible directions of the "short" end of the Y-elements (at Y14 and Y21). The diverging switch at Y1 is operated by reversing the direction of rotation of the rotary magnetic field for two periods: the direction of rotation then changes twice. If the series of elements T8, I7, T9 is further continued, there are in fact two diverging switches successively connected, it being possible to operate each switch by one reversal of the rotary magnetic field. Other forms of diverging switch are also known.

Figure 3:
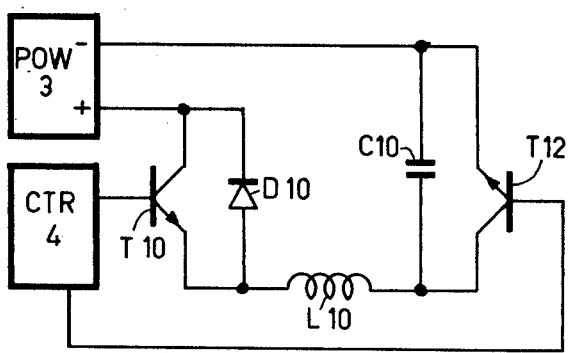
FIG. 3 shows a first embodiment according to the invention.

FIG. 3 shows a first embodiment according to the invention which can be used in a device as shown in FIG. 1 or FIG. 2 or in other devices in which time-dependent currents have to be passed through a coil. The device comprises a power supply POW3, a control unit CTR4, two transistors T10, 12, a diode D10, a capacitor C10 and a coil L10. The capacitor C10 and the coil L10 together constitute an oscillator circuit. The transistors are used as switches, so that the dissipation therein is low. Assume that there is no voltage present on capacitor C10. When a positive control voltage pulse is applied from the control unit CTR4 to the base electrode of the transistor T10, the latter is rendered conducting. During a first quarter of a period the current through the coil L10 increases according to a sine function. During a second quarter of a period, the current through the coil decreases again, but the voltage on the capacitor increases further to twice the output voltage of the power supply POW3. During the first half period the diode D10 is energized in the reverse direction. During a third quarter of a period, the current in the coil reverses its direction, with the result that the diode D10 operates in the forward direction and the transistor T10 operates in the reverse direction; the voltage across the capacitor C10 then decreases again. During the fourth quarter of a period the voltage across the capacitor C10 decreases further, like the current through the coil L10. During the entire second half period the positive control current signal on the base electrode of transistor T10 can be terminated, so that the tolerance is broad. After one period of the sinusoidal current, a residual charge is still present due to the circuit losses. This charge is depleted by a positive control pulse on the base electrode of the transistor T12. The circuit is then ready again for a next cycle. After some periods (for example, after the odd periods) the depletion of the residual charge can possibly be omitted for faster operation. The circuit of figure 3 preferably comprises only npn-transistors because they offer a wider choice.

Figure 4:
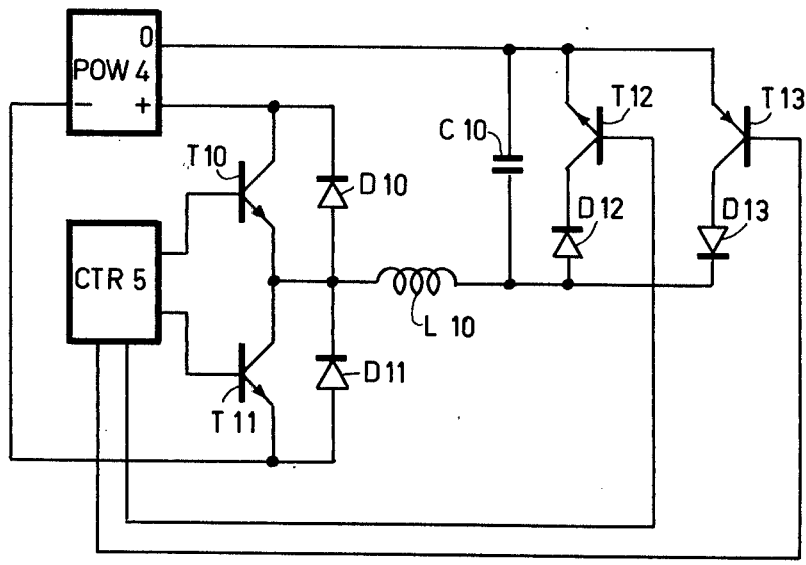
FIG. 4 shows a two-way version of FIG. 3.

FIG. 4 shows a two-way extension of FIG. 3. New elements with respect to FIG. 3 are the power supply POW4, the control unit CTR5, the transistors T11, 13 and the diodes D11, 12, 13. The circuit can first of all be used in the same manner as that of FIG. 3, the transistors T11, 13 being continuously cut off and the transistor T10 being conducting for a period of time of between one half and one whole period of the oscillator circuit. Because of the added elements, there can now similarly be a period of the current in the opposite sense. The diodes D12, 13 serve to prevent the associated transistors T12, 13, respectively, from becoming conducting when the collector voltage is applied in the wrong direction.

Figure 5:
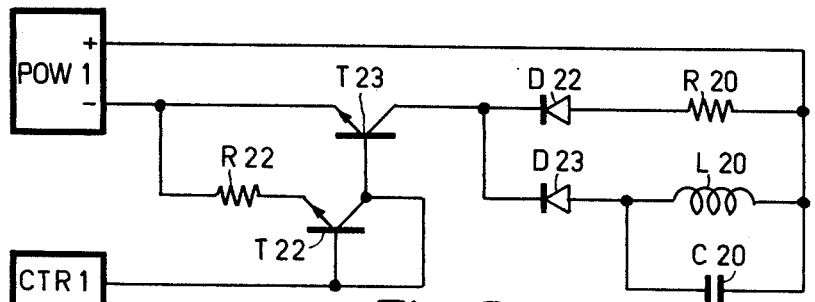
FIG. 5 shows a second embodiment according to the invention.

FIG. 5 shows a second embodiment according to the invention. The device comprises a power supply POW1, a control unit CTR1, two transistors T22,23, a coil L20, a capacitor C20, two diodes D22,23 and two resistors R20,22. With the exception of the control unit CTR1 and the coil L20, all elements can form part of a rotary magnetic field generator such as DRI1 of FIG. 1. The base current of the transistor T22 renders the transistor T23 conducting such that a current source having a high internal impedance is formed. This controllable current source circuit is known as a "current mirror." The resistor R22 can possibly be omitted. Other circuits comprising, for example, three transistors are also known. Controllable current source circuits which are completely different are also known per se.

In the stationary condition the transistor T23 is conducting. If the coil L20 is a magnetic coil for generating a component of the rotary magnetic field in a device as shown in FIG. 1, the bubbles are positioned in well-defined positions without experiencing much interference from irregularities in the plate of magnetic material or the bubble guide structure. If the transistor T23 is then cut off by a control current signal from the control unit CTR1, the current through the coil L20 initially decreases slowly and subsequently ever faster according to a cosine function. The energy of the magnetic field is then stored in the capacitor C20: the voltage thereacross reverses its sign and can become much higher than in the stationary condition. Diode D23 remains conducting in the forward direction, but diode D22 is actuated in the reverse direction; however, the transistor T 23 remains cut off. During the second quarter of a period the current in the coil reverses its direction. If the circuit composed of L20 and C20 has only limited losses, it regains substantially its original absolute value: the voltage on capacitor C20 has then substantially disappeared. During the third quarter of a period the current decreases again, and the voltage across the capacitor increases again, be it with the same sign as in the stationary condition. However, diode D23 is then actuated in the reverse direction. During the fourth quarter of a period the current in the coil increases again and regains substantially its initial value and direction. During the second half period (diode D23 is then active in a blocking capacity) a further control current signal can render the transistor T23 conducting again. When the voltage across capacitor C20 then regains its original polarity, the current through the transistor T23 can be superimposed on the oscillating current in the circuit. As a result, both diodes D22,23 can be actuated in the forward direction, with the result that the resistor R20 then forms part of the parallel circuit. If this resistor has the value $R\ 20\ =\ \frac{1}{2}\ \sqrt{L20/C20}$, the circuit is critically damaged and no ringing will occur after one period. As a result, a next period can be started quickly after the first period, whilst the current levels remain determined by the controllable current source circuit. If the losses are small, the circuit can also perform, for example, two periods in that the transistor is returned to the conducting state only in the fourth half period. The tolerance as regards the instant of the restarting of the transistor T23 is approximately one half period of the natural frequency of the circuit. If the device is used in a store comprising magnetic bubbles and if the store has been in the rest condition for a prolonged period of time, the current in the coil L20 can be attenuated by a changed control signal and the dissipation can be reduced. The maximum voltage across the transistor T23 is substantially equal to the peak voltage across the capacitor. The voltage across the transistor T22 is comparatively low. The circuits of figures 3–5 can produce current amplitudes of, for example, 3 A in an inductance of 20 $\mu$H at a frequency of 100 kHz.

Figure 6:
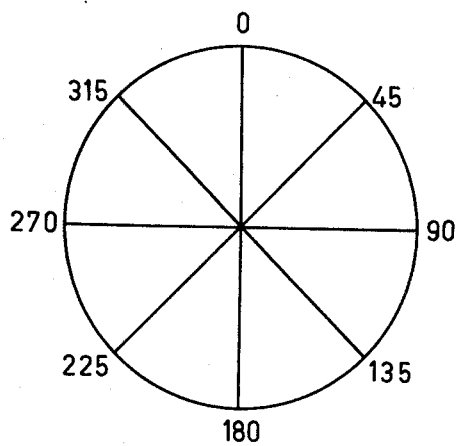
FIG. 6 shows a phase diagram of a rotary magnetic field to be generated.

FIG. 6 shows a diagram in the form of a wind rose of rotary magnetic field directions to be produced. The directions are denoted in degrees with respect to a reference direction. When a rotary magnetic field is generated, various possibilities exist. First of all, the rotary magnetic field can continuously rotate in a plane at the same direction of rotation, for example, continuously counter-clockwise. In that case two devices according to FIG. 3 can be used, having the orientations 0° and 90°, respectively. The orientation is defined as the direction of the axis of the coil. If the duration of the discharging of the capacitor is short with respect to a quarter of a period, the magnetic field rotates at a substantially uniform angular speed and constant amplitude, whilst the phase of the oscillators differs 90°. If the duration of the discharging is no longer negligibly short, the field strength decreases for some time. If the duration of the discharging exceeds one quarter of a period, the field decreases to zero. In the case of a discharging time of one half period, the following orientations are obtained for the rotary magnetic field:

| After periods | first direction | second direction | total |
|---|---|---|---|
| 0 | 0° | — | 0° |
| ¼ | — | 90° | 90° |
| ½ | 180° | — | 180° |
| ¾ | — | 270° | 270° |
| 1 | — | — | — |
| 1¼ | — | — | — |
| 1½ | 0° | — | 0° |
| 1¾ | — | 90° | 90° etc. |

In some cases it is not objectionable that the field becomes zero.

A second possibility consists in that the rotary magnetic field always rotates in one direction, whilst in a rest position a substantial magnetic field must be present. A feasible combination is:

a. a device as shown in FIG. 3 having the orientation 90°;

b. a device as shown in FIG. 5 having the orientation 0°.

In that case there is a rotary magnetic field having the orientation 0° (or 180°) in the rest state. A cycle is then controlled in that both generators complete a period at the same phase.

A third possibility consists in that the rotary magnet has two possible directions of rotation, but the reversing point is always from an orientation 0°. If the rotary magnetic field must then always have an approximately fixed absolute value, the following is a feasible combination:
   a. a device as shown in FIG. 4 having the orientation 90°;
   b. a device as shown in FIG. 5 having the orientation 0°.

Depending on the fact whether transistor T10 or transistor T11 is actuated, either clockwise or counterclockwise rotation will then take place. A cycle is controlled again in that both generators complete a period at the same phase.

What is claimed is:

1. A device for generating a time-dependent current, comprising
   at least three current connection terminals of different potential;
   an oscillator circuit;
   control means, connected to said oscillator circuit; and
   two switching means, each having a first terminal connected to a respective current connection terminal of extreme potentials, a second terminal connected to said oscillator circuit, and a third terminal connected to said control means, said two switching means being operative to control the current to said oscillator circuit.

2. A device as defined in claim 1, wherein oscillator circuit is connected in series between said second terminals of said two switching means and one of said current connection terminals.

3. A device as defined in claim 2, wherein said one current connection terminal is of intermediate potential.

4. A device as defined in claim 1, wherein said oscillator circuit comprises a coil and a capacitor, and further comprising discharge means connected parallel to said capacitor for discharging residual change between operable cycles of said device.

5. A device as defined in claim 1, wherein further comprising rectifying means connected between said first and said second terminals respectively of said two switching means.

6. A device as defined in claim 4, wherein said discharge means comprises a diode and a transistor, one terminal of said diode being connected to the junction connection between said coil and said capacitor, the other terminal of said diode being connected to said transistor.

7. An arrangement comprising
   at least two current connection terminals of different potential;
   a magnetic bubble guide structure;
   an oscillator circuit; for controlling the movement of magnetic bubles in said guide structure;
   control means, connected to said oscillator circuit; and two switching means, each having a first terminal connected to respective current connection terminals, a second terminal connected to said oscillator circuit, and a third terminal connected to said control means, said two switching means being operative to control the current to said oscillator circuit.

* * * * *

UNITED STATES PATENT AND TRADEMARK OFFICE
CERTIFICATE OF CORRECTION

PATENT NO. : 3,958,160
DATED : May 18, 1976
INVENTOR(S) : EDMOND DE NIET ET AL

It is certified that error appears in the above-identified patent and that said Letters Patent are hereby corrected as shown below:

Column 1, line 31, "aseries" should be --a series--
line 39, "moreoverr" should be --moreover--

Signed and Sealed this

Eighteenth Day of January 1977

[SEAL]

Attest:

RUTH C. MASON
Attesting Officer

C. MARSHALL DANN
Commissioner of Patents and Trademarks